United States Patent [19]
Huggins et al.

[11] Patent Number: 5,945,238
[45] Date of Patent: Aug. 31, 1999

[54] METHOD OF MAKING A REUSABLE PHOTOLITHOGRAPHY MASK

[75] Inventors: Alan H. Huggins, Gilroy; John MacPherson, Fremont; Richard J. Schmidley, San Jose, all of Calif.

[73] Assignee: Clear Logic, Inc., Santa Clara, Calif.

[21] Appl. No.: 09/020,080

[22] Filed: Feb. 6, 1998

[51] Int. Cl.$^6$ ............................... G03F 5/00; G03F 9/00
[52] U.S. Cl. .................................................................. 430/5
[58] Field of Search .................................................... 430/5

[56] References Cited

U.S. PATENT DOCUMENTS

| | | | |
|---|---|---|---|
| 4,475,811 | 10/1984 | Brunner | 430/5 |
| 5,552,249 | 9/1996 | Jensen et al. | 430/5 |

*Primary Examiner*—Christopher G. Young
*Attorney, Agent, or Firm*—Skjerven, Morrill, MacPherson, Franklin & Friel LLP; Tom Chen

[57] ABSTRACT

A method is provided for making re-usable configuration masks by initially patterning a mask blank using precision mask-making tools. The mask is then covered with an opaque material, and desired configuration points for a particular ASIC are selected with a non-precision laser. After the particular configuration pattern is no longer needed, the remaining opaque material is removed. The mask can then be re-configured for a new design by covering the mask with a new layer of opaque material and selecting new configuration points. Such a mask reduces both time and costs for creating a set of mask designs because a single mask can be re-used for several different designs without the further need of precision mask-making tools.

26 Claims, 7 Drawing Sheets

METHOD OF MAKING A REUSABLE PHOTOLITHOGRAPHY MASK

BACKGROUND

1. Field of Invention

The present invention relates to photolithography masks and more particularly to methods of reusing such masks in the manufacturing of integrated circuits.

2. Related Art

As is well known in the art, both precision and non-precision configuration masks can be used to customize integrated circuits by patterning specific images onto a photoresist layer of a semiconductor device during the photolithography processing step. A precision configuration mask is typically created by using precision mask-making tools, such as an electron-beam or pattern generator, to define all features on the mask. For non-precision masks, only the reticle alignment marks and other large peripheral features are typically created by using precision mask-making methods. Non-precision targeting energy beam tools, such as a non-precision laser (e.g., the Model 1225hp manufactured by Electro-Scientific Inc. of Portland, Oreg.), can then be used to define the desired non-precision configuration patterns. Note that for descriptive purposes only, any non-precision targeting energy beam tool will be referred to hereinafter as a non-precision laser.

Making both precision and non-precision masks requires precision mask-making tools because of the need to place the reticle alignment marks within the strict tolerances specified by stepper manufacturers. For example, ASM Lithography of Veldhoven, The Netherlands, requires that placement dimensions relative to the center of the mask be within ±0.25 microns for their Model 2500 stepper. Without a reference set of alignment targets already patterned on the mask, many non-precision lasers cannot meet these sort of tolerance requirements. If the alignment targets are not placed within the specified tolerance, the image on the mask may be shifted, resulting in an unacceptably large registration error of the pattern on the wafer.

Other features on the periphery of the mask do not require the placement accuracy and dimension control of a precision mask-making tool. Even so, non-precision targeting energy beam tools, such as lasers, are not a suitable alternative for creating the large geometries (e.g., 0.1 mm to 5 mm) typically found in this region of the mask due to the very small spot size (e.g. 3 $\mu$m to 6 $\mu$m) used by the laser. Therefore, using a non-precision laser to create these large features requires significantly more time than using a precision mask-making tool that uses either multiple beams, large area exposures, or higher raster rates for the large geometries. As a result, by using precision mask-making tools, very high write rates are possible when creating large peripheral features on the mask. Even though the cost of using a precision mask-making tool is higher, the overall write-time is significantly less, resulting in a lower overall cost than using a non-precision laser to create the large geometries.

However, because of the high cost of using precision mask-making equipment, it is desirable to further reduce the cost of producing the configuration mask by eliminating or reducing the use of the precision mask-making equipment.

SUMMARY

The present invention provides a method by which a single configuration mask created by precision mask-making equipment can be continually re-patterned to produce new configuration patterns using only a non-precision laser.

In one embodiment of the present invention, an application-specific integrated circuit (ASIC) configuration mask is manufactured using conventional precision mask-making techniques to produce a mask having the following initial openings: patterned equipment-specific alignment targets along the mask periphery, any other peripheral patterns (such as bar codes, pellicle alignment marks, or any other commonly required features), and openings and/or patterns that will uncover all the potential desired configuration points on the circuit.

The mask is next coated with an opaque material (a material which will prevent transmission of greater than 50% of the exposure energy for a given exposure tool) to cover all the potential configuration points or all the initial openings. The opaque material is patterned using a non-precision laser to define a specific configuration pattern and desired portions of the material are removed to create the desired ASIC mask. The mask can now be used in a conventional photolithography patterning machine to pattern the desired configuration points on a configurable ASIC device. Once the configuration pattern on the mask is no longer needed, the material can be removed using conventional techniques, thereby leaving the mask available for another use. This process can be repeated to create many different custom precision configuration masks without further using precision mask-making equipment.

In another embodiment, an ASIC configuration photomask is manufactured using conventional mask-making techniques to produce a mask having different initial openings from the prior embodiment. These openings include patterned equipment-specific alignment targets along the mask periphery, any other peripheral patterns, and a large open area representing the usable field area for the stepper.

The mask is then coated with an opaque material to cover all the large open area or all the initial openings. The opaque material is patterned using a non-precision laser to define a specific configuration pattern and desired portions of the material are removed to create the desired ASIC mask. As with the prior embodiment, the mask can now be used to pattern a device. Once the pattern is no longer needed, the opaque material is removed with conventional methods to again expose all the initial openings. This process can be repeated to create numerous different configuration patterns on a single mask without the need to use precision mask-making tools for each different pattern.

Suitable opaque materials for both embodiments include opaque photo-sensitive material or metals such as aluminum. If photo-sensitive material is used, the material can be patterned by using the non-precision laser to expose and develop selected portions of the material (i.e., areas over undesired configuration points if negative-tone material or areas over desired configuration points if positive-tone material). If a metal is used, the material can be patterned either directly by ablation or with photoresist, depending on certain properties of the metal. If the metal has properties that allow it to be ablated with a laser without affecting or damaging the underlying layer, a non-precision laser can be used to directly remove the metal to create the desired pattern. Otherwise, photoresist (positive or negative) can be formed on the metal layer, and the photoresist patterned with the laser. Desired portions of the resist are removed to uncover selected areas of the metal. The metal is then etched to create the desired configuration mask.

Therefore, because many different configuration mask patterns can be created while only using precision mask-making tools once (to pattern the initial openings), the cost of manufacturing ASICs is greatly reduced.

This invention will be more fully understood upon consideration of the detailed description below, taken together with the accompanying drawings.

BRIEF DESCRIPTION OF DRAWINGS

The use of the same reference numbers in different figures indicates the same or like elements.

DETAILED DESCRIPTION

The present invention provides a method for re-using the patterns created on a photolithography mask by precision mask-making equipment by repeatedly changing the mask to produce a new configuration pattern using only a non-precision laser.

FIGS. 1A–4B illustrate steps for re-using precision configuration masks that are employed in the manufacture of integrated circuits according to one embodiment of the present invention, where a non-precision laser selects desired configuration points from a pattern of all possible configuration points.

Figure 1A:
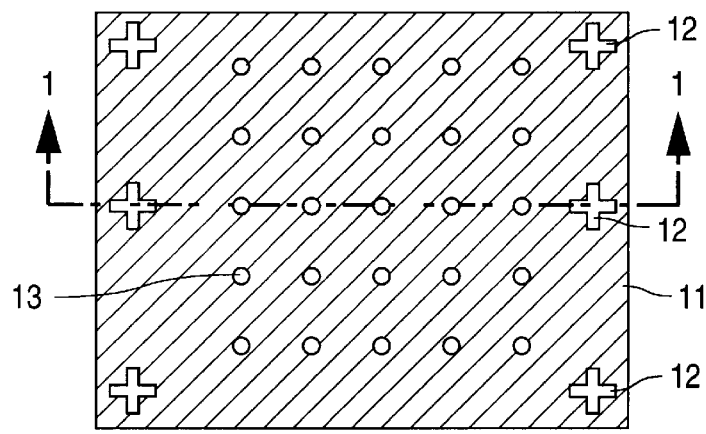
FIGS. 1A–4B are top and side views of steps for re-using photolithography masks according to one embodiment of the present invention.
Figure 1B:
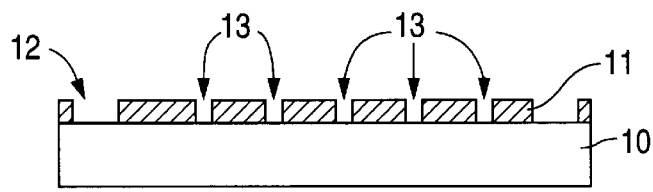

In FIGS. 1A and 1B, a layer of opaque material 11 is patterned after being deposited on a transparent substrate material 10. FIG. 1A is a top view, and FIG. 1B is a side view along sectional lines 1—1 of FIG. 1A. The subsequent figures will use the same lettering system to designate top and side views. Referring to FIGS. 1A and 1B, opaque material 11 is patterned with initial openings, which include equipment-specific alignment targets and/or other peripheral patterns 12 (such as bar codes, pellicle alignment marks, or any other commonly required features) and all the potential desired configuration points 13 for customizing a circuit. The initial openings are patterned according to conventional precision methods, while subsequent steps will select the desired configuration points for customizing application-specific integrated circuits (ASICs).

Figure 2A:
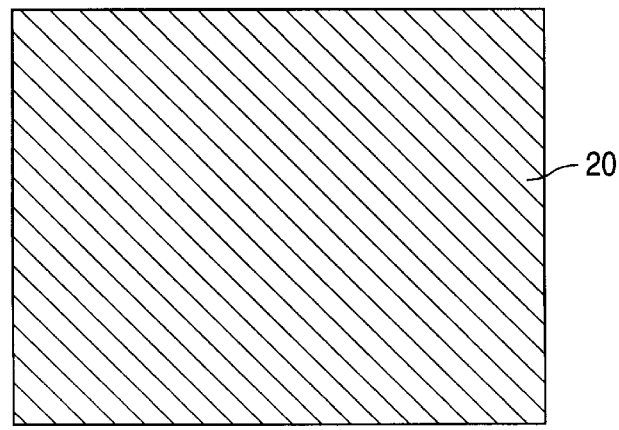
Figure 2B:
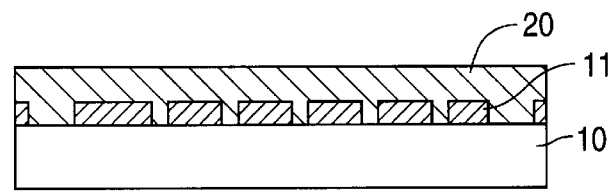

In FIGS. 2A and 2B, the entire mask is then coated with an opaque negative-tone photo-sensitive material 20. Material 20 can be photoresist, polyimide, emulsion, or other translucent or opaque materials.

Figure 3A:
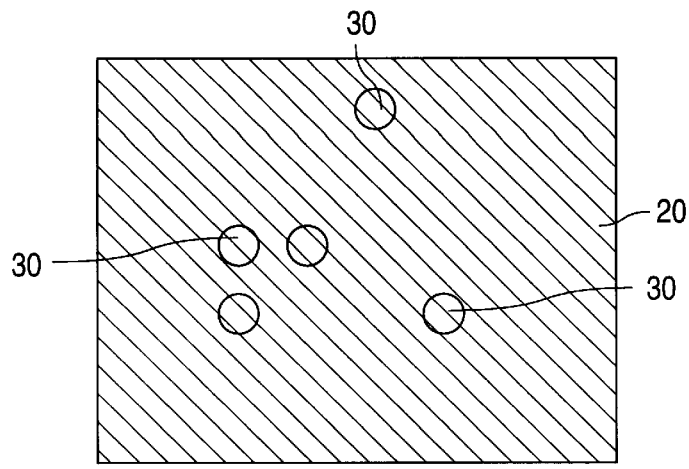
Figure 3B:
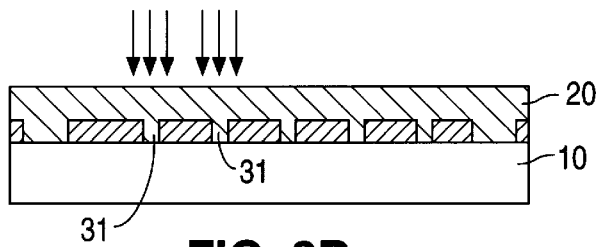

In FIGS. 3A and 3B, a non-precision laser exposes portions 30 of material 20 overlying undesired configuration points 31 for a particular ASIC.

Figure 4A:
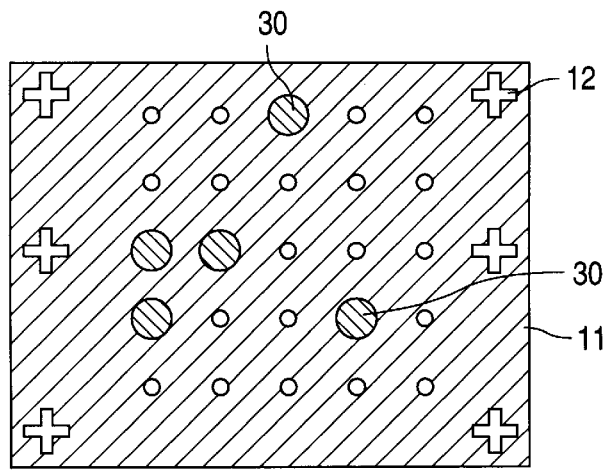
Figure 4B:
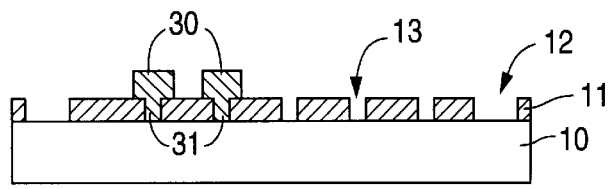

Material 20 is then developed, and the unexposed portions of material 20 are removed to uncover the desired configuration points, leaving exposed portions 30 of material 20 to cover the undesired configuration points 31, as shown in FIGS. 4A and 4B. These remaining portions of material 20 block the ultraviolet (UV) light that would normally pass through any uncovered initial openings of the mask. If material 20 is not initially opaque to UV light, the material is further processed to scatter or block the light using known techniques. For example, if material 20 is photoresist, processing can be an aggressive bake combined with UV flood exposure to reticulate the photoresist film. Alternatively, the photoresist can be exposed to a low-power, high fluorine content plasma. This will cause cross-linking of the polymers in the photoresist, thereby increasing the opacity of the film and blocking the ultraviolet light.

The mask can now be used in a conventional photolithography patterning machine (e.g., a stepper, projection aligner, or step and scan stepper) to pattern the desired configuration points on a configurable ASIC device. Once the configuration pattern on the mask is no longer needed, the remaining negative-tone photo-sensitive material 20 can be removed using standard resist stripping or other conventional techniques, leaving the mask as shown previously in FIGS. 1A and 1B and available for re-patterning. This process can be repeated to create different custom precision configuration masks by using a non-precision laser to expose different patterns of undesired configuration points. As a result, many different ASICs can be configured using a single mask and without the need to re-pattern the geometries created by the precision mask-making equipment.

Although the above description utilizes a negative-tone photo-sensitive material, a positive-tone photo-sensitive material can alternatively be used to cover the mask. With a positive-tone photo-sensitive material, the laser is used to expose portions of the material overlying desired, rather than undesired, configuration points. In deciding whether to use negative-tone or positive-tone photo-sensitive material, the number of desired configuration points for the particular ASIC may be a factor. If this number is high, a negative-tone photo-sensitive material may be desired because laser use is decreased due to a smaller number of undesired configuration points for the laser to expose. If this number is low, a positive-tone photo-sensitive material may be desired due to a smaller number of desired configuration points for the laser to expose. By reducing laser use, both time and cost are reduced.

Figure 5A:
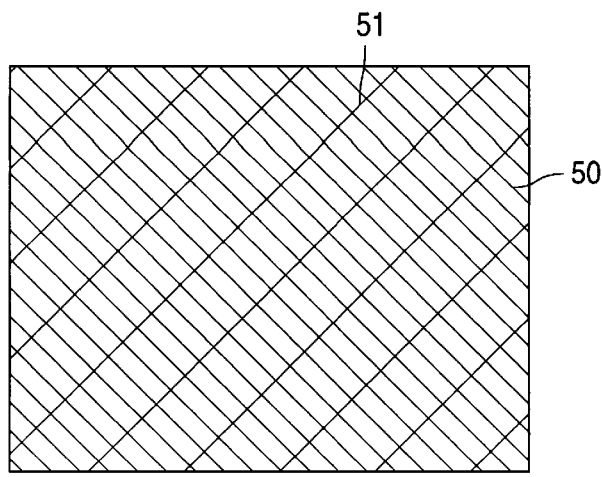
FIGS. 5A–7B are top and side views of steps for re-patterning the mask of FIGS. 1A and 1B according to another embodiment of the present invention.
Figure 5B:
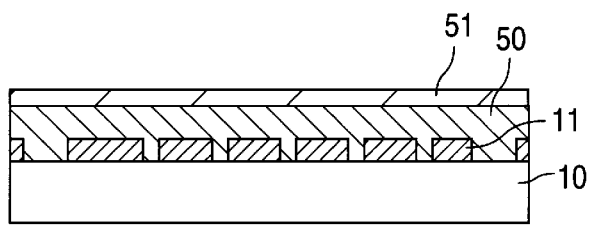

FIGS. 5A–7B illustrate another way of re-patterning the mask of FIGS. 1A and 1B. In FIGS. 5A and 5B, the mask is sputtered with a film of aluminum or other suitable metal 50 (which is opaque and can be selectively etched from the initial opaque layer 11) after the mask is configured with the same initial openings 12 and 13 as before. The mask is next coated with a negative-tone photo-sensitive material, such as negative photoresist 51.

Figure 6A:
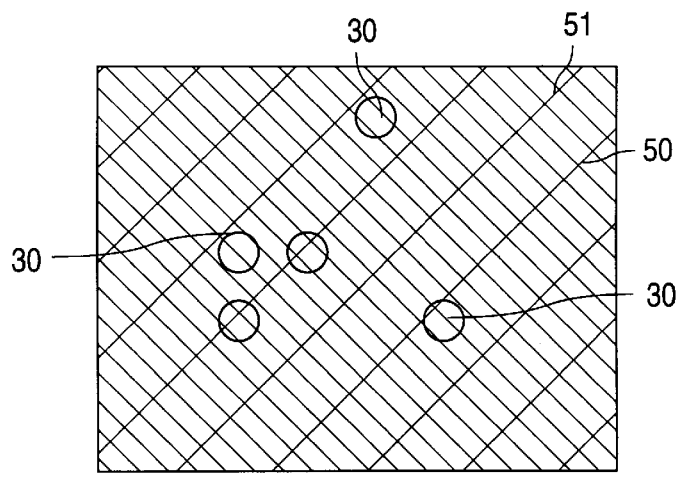
Figure 6B:
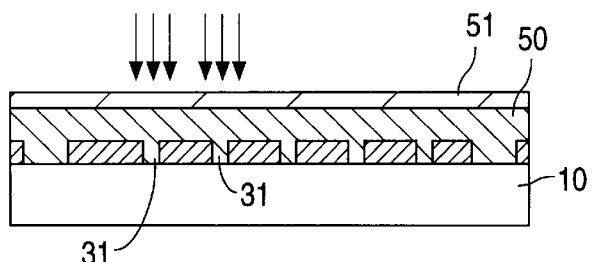

In FIGS. 6A and 6B, a non-precision laser is used to expose portions of photoresist 51 overlying undesired configuration points for a particular ASIC.

Figure 7A:
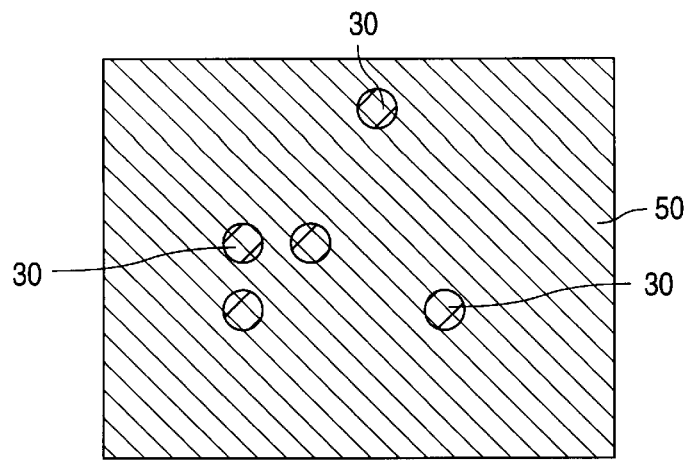
Figure 7B:
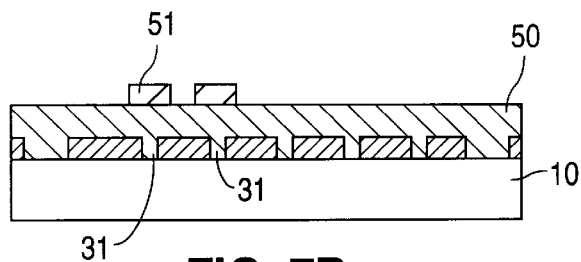

In FIGS. 7A and 7B, photoresist 51 is developed, and the unexposed material is removed to uncover areas of metal 50 over the desired configuration points. The uncovered areas of the metal are then etched to remove the metal over desired configuration points, resulting in the configuration mask of FIGS. 4A and 4B. The remaining portions 30 of the metal block UV light from passing through the undesired configuration points of the mask. Positive-tone photo-sensitive material, such as positive photoresist, can also be used so that the non-precision laser exposes portions of the photoresist overlying desired, instead of undesired, configuration points.

The mask can now be used in a conventional photolithography patterning machine to pattern the desired configuration points on a configurable ASIC device. Once the configuration pattern on the mask is no longer needed, the remaining metal can be removed using sulfuric acid stripping or other conventional techniques, and then re-sputtered with a new film of metal, thus making the mask available for re-patterning.

Figure 8A:
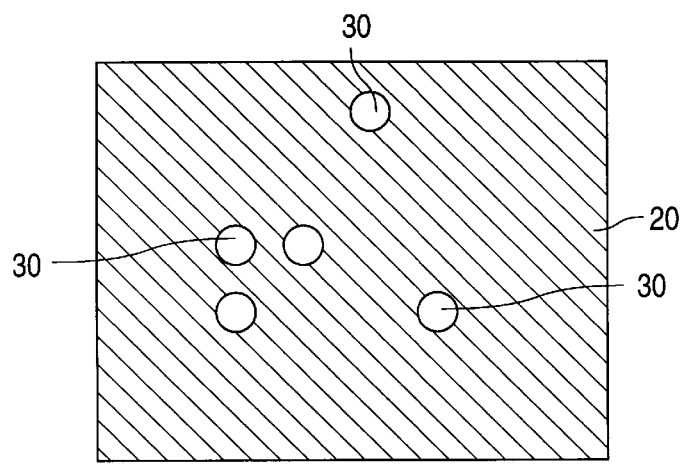
FIGS. 8A and 8B are a top and side view for re-patterning the mask of FIGS. 1A and 1B according to another embodiment.
Figure 8B:
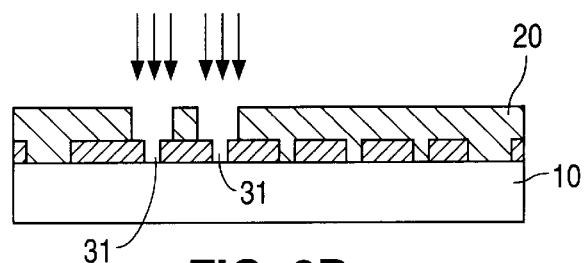

In another embodiment of re-patterning the mask of FIGS. 1A and 1B, the opaque layer 20 of FIGS. 2A and 2B is a sputtered film of aluminum or other suitable opaque material having properties that allow it to be ablated with a lower energy laser while not affecting and/or ablating the underlying opaque material 11. A non-precision laser is then used to ablate the aluminum from areas 30 on the mask overlying desired configuration points 31, as shown in FIGS. 8A and 8B. The resulting non-precision custom mask can then be used to configure the desired ASIC. After the remaining aluminum is removed, e.g., by using sulfuric acid stripping or other conventional techniques, and re-sputtered with a new film of metal, the mask can be re-patterned for another configuration.

FIGS. 9A–11B illustrate steps for re-using non-precision configuration masks that are employed in the manufacture of integrated circuits according to another embodiment of the present invention, where a non-precision laser creates the desired configuration points within the usable field area of the mask.

Figure 9A:
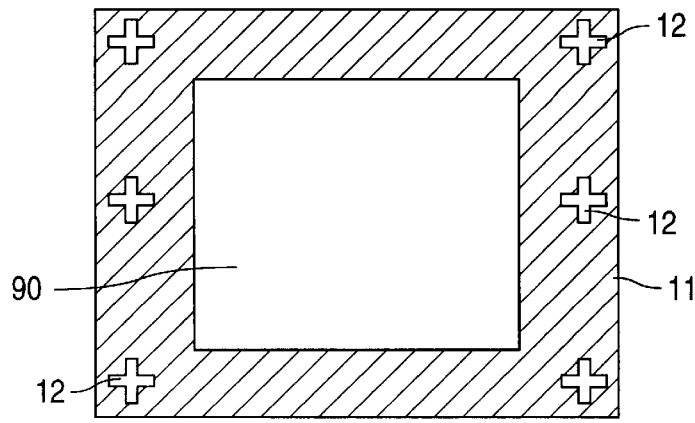
FIGS. 9A–11B are top and side views of steps for re-using photolithography masks according to another embodiment of the present invention.
Figure 9B:
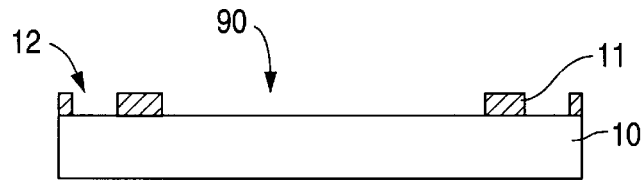

FIGS. 9A and 9B show a layer of opaque material 11 (e.g., chrome) which is patterned after being deposited on transparent substrate material 10. Opaque material 11 is patterned with initial openings, which include equipment-specific alignment targets and/or other peripheral patterns 12 required by the stepper along and a large open area 90 representing the usable field area for the stepper.

Figure 10A:
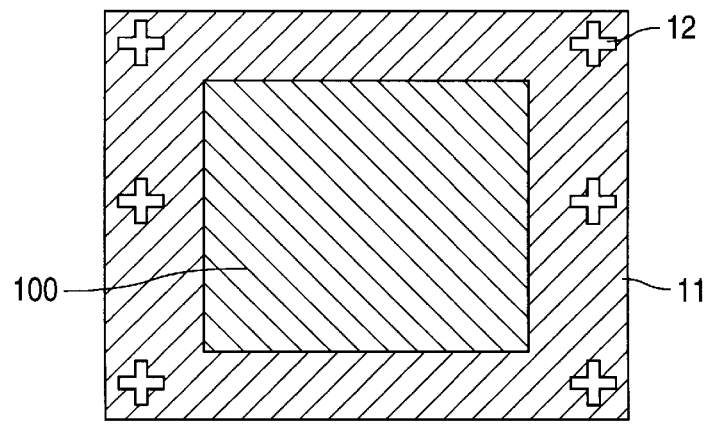
Figure 10B:
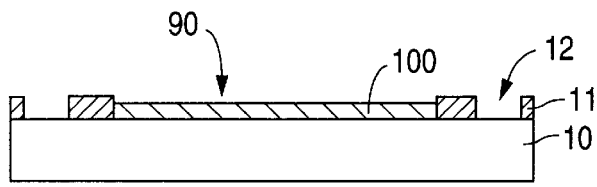

In FIGS. 10A and 10B, a film of aluminum or other suitable opaque material 100 is sputtered onto the mask as alignment targets and/or other peripheral patterns 12 are being protected with a metal stencil or another conventional technique. As a result, material 100 covers the portion of area 90 while leaving alignment targets and/or other peripheral patterns 12 uncovered. If desired, material 100 can be sputtered onto the entire mask so that patterns 12 can be uncovered during subsequent patterning steps with the non-precision laser.

Figure 11A:
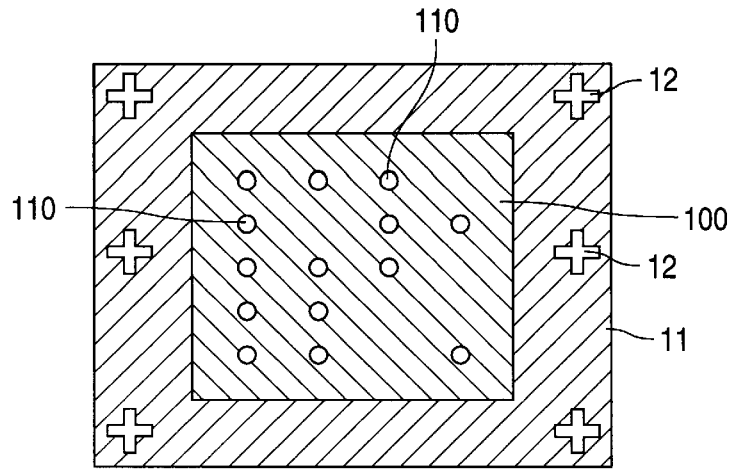
Figure 11B:
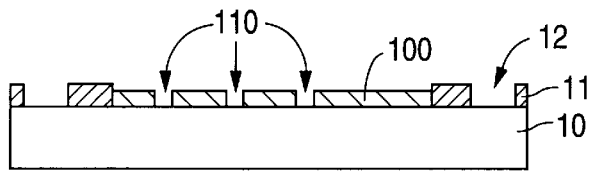

In FIGS. 11A and 11B, a non-precision laser is used to ablate material 100 at desired configuration points 110. Material 100 has properties that make it opaque to UV light and ablatable by the laser, while not damaging underlying transparent substrate 10. The resulting non-precision configuration ASIC mask can now be used to pattern desired ASIC devices. Once the configuration pattern on the mask is no longer needed, the remaining material 100 can be removed using sulfuric acid stripping or other conventional techniques to remove the metal without removing or damaging the opaque material 11 defining the alignment targets and/or other peripheral patterns 12. Thus, the mask is returned to the state shown in FIGS. 9A and 9B, and the process can be repeated, with the laser selecting different configuration points, to configure a non-precision mask for another use. Material 100 can be replaced with an opaque material (e.g., positive or negative photo-sensitive material) to cover the large open area of the mask, as long as exposure by the non-precision laser creates the desired configuration points.

Figure 12A:
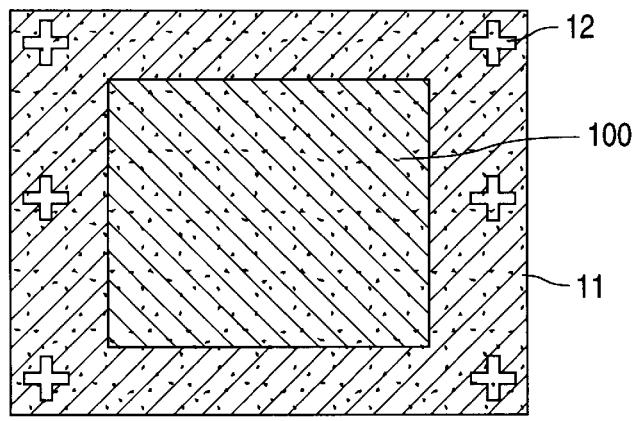
FIGS. 12A–14B are top and side views of steps for re-patterning the mask of FIGS. 9A and 9B according to another embodiment.
Figure 12B:
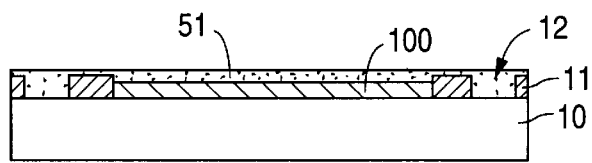

FIGS. 12A–14B show another embodiment for re-patterning the mask of FIGS. 9A and 9B. In FIGS. 12A and 12B, a film of aluminum or other suitable opaque material 100 (such as metal) is sputtered onto the large open area of the mask, and the entire mask is coated with a negative-tone photo-sensitive material, such as negative photoresist 51. In other embodiments, photoresist 51 covers only the large open area of the mask. Again, material 100 can also be sputtered onto the entire mask so that patterns 12 can be uncovered during subsequent patterning steps with the non-precision laser.

Figure 13A:
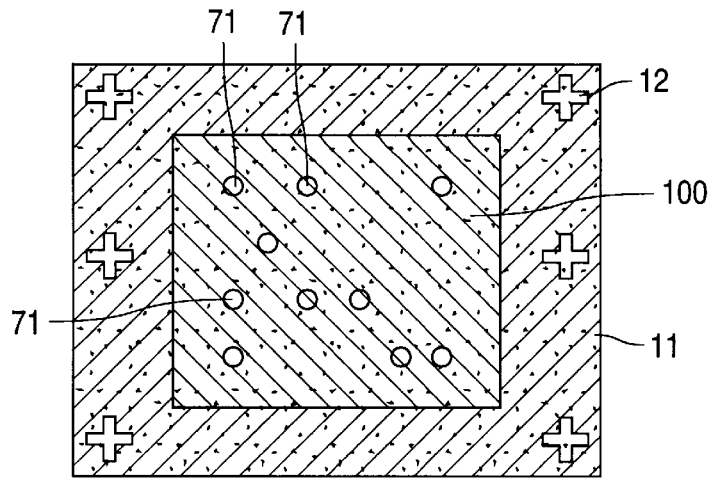
Figure 13B:
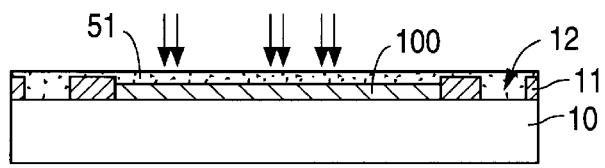
Figure 14A:
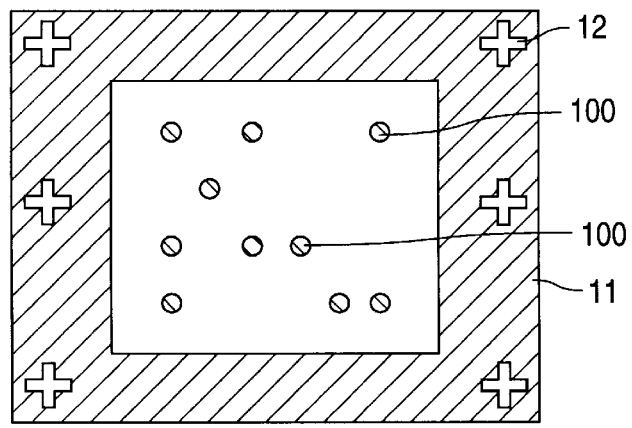
Figure 14B:
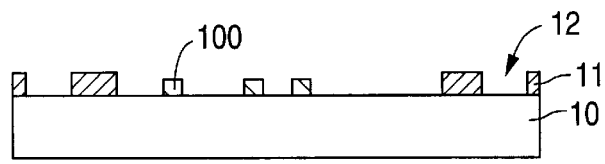

In FIGS. 13A and 13B, a non-precision laser is used to expose portions of photoresist 51 overlying undesired configuration points 71 for a particular ASIC. The photoresist is then developed, and the unexposed portions removed to leave desired areas of material 100 uncovered. The uncovered metal is then etched and resist stripped to produce the custom mask of FIGS. 14A and 14B. The non-precision custom mask can then be used to configure the desired ASIC. Once the configuration pattern on a mask is no longer needed, the remaining aluminum can be removed using sulfuric acid stripping or other conventional techniques, and then re-sputtered with a new film of metal and coated with resist to make the mask available for another use.

By having the ability to re-pattern configuration masks without the further need of precision mask-making tools, the present invention reduces both time and costs in the manufacture of precision and non-precision masks. Lead-time is reduced because a new mask can be created by simply re-configuring the old mask. Costs are reduced because a new mask can be made at approximately the same cost as doing a conventional patterning step on a wafer. This cost reduction can be as much as 95% of the cost of creating a new mask with alignment targets, peripheral features, and configuration points. Costs are also reduced because the user can reduce the inventory of custom masks. A single re-usable mask can replace many custom masks because the single re-usable mask can be reconfigured to create several different desired designs.

The user may also benefit from having more types of different mask configurations to use. For example, due to cost constraints, a certain mask might not be made if that mask were only to be used for testing or prototypes or for low volume orders. However, with the much lower cost associated with the present invention, such masks become economically feasible. As an example, prototype designs could be batched together on one mask; the single mask could then be reconfigured and used for any one or combination of the prototypes. Similarly, one prototype design could be included with multiple copies of a high-volume or low-volume designs on one mask; the single mask could then be reconfigured and used for the prototype design or for the high-volume or low-volume design. Both these examples reduce the cost for producing prototypes or other low volume designs.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

We claim:

1. A method of making reusable photolithography masks, comprising the steps of:

depositing an opaque layer on a transparent substrate;

patterning said opaque layer with a first pattern using a precision technique;

depositing a removable layer on said opaque layer and said substrate; and patterning said removable layer with a second pattern using a non-precision technique.

2. The method of claim 1, wherein said removable layer is photo-sensitive.

3. The method of claim 2, wherein said non-precision technique uses a non-precision laser.

4. The method of claim 2, further comprising the steps of removing remaining portions of said removable layer and repeating said steps of depositing and patterning a removable layer.

5. The method of claim 2, wherein said first pattern comprises peripheral features.

6. The method of claim 5, wherein said peripheral features include alignment targets.

7. The method of claim 6, wherein said first pattern further comprises all possible configuration points.

8. The method of claim 7, wherein said first pattern further comprises all possible configuration points and patterns for a plurality of devices.

9. The method of claim 8, wherein said plurality of devices are different.

10. The method of claim 2, wherein said removable layer is opaque when deposited.

11. The method of claim 2, wherein said removable layer is not opaque when deposited, further comprising the step of processing said removable layer such that said removable layer becomes opaque.

12. The method of claim 2, wherein said removable layer is negative-tone photo-sensitive.

13. The method of claim 12, wherein said step of patterning said removable layer comprises exposing portions of said removable layer overlying undesired areas of an underlying pattern and removing unexposed portions of said removable layer to uncover desired areas of said underlying pattern.

14. The method of claim 2, wherein said removable layer is positive-tone photo-sensitive.

15. The method of claim 14, wherein said step of patterning said removable layer comprises exposing portions of said removable layer overlying desired areas of an underlying pattern and removing said exposed portions of said removable layer to uncover said desired areas of said underlying pattern.

16. The method of claim 1, wherein said removable layer is not photo-sensitive.

17. The method of claim 16, wherein said removable layer is a metal layer.

18. The method of claim 17, wherein the step of patterning said removable layer comprises selectively ablating said removable layer with a non-precision laser.

19. The method of claim 17, further comprising depositing a photo-sensitive layer on said removable layer.

20. The method of claim 19, wherein the step of patterning said removable layer comprises patterning said photo-sensitive layer followed by removing said desired areas from said removable layer.

21. The method of claim 16, wherein said first pattern includes peripheral features and a usable field area for a stepper.

22. The method of claim 21, wherein said removable layer is positive-tone photo-sensitive.

23. The method of claim 21, wherein said removable layer is ablatable.

24. The method of claim 23, wherein the step of patterning said removable layer comprises selectively ablating said removable layer with a non-precision technique.

25. The method of claim 21, further comprising depositing a photo-sensitive layer on said removable layer.

26. The method of claim 25, wherein the step of patterning said removable layer comprises patterning said photo-sensitive layer followed by removing desired areas from said removable layer.

* * * * *